(12) United States Patent
Ye et al.

(10) Patent No.: US 12,169,640 B2
(45) Date of Patent: Dec. 17, 2024

(54) READ RETRY METHOD FOR ENHANCING READ PERFORMANCE AND STABILITY OF 3D NAND MEMORY

(71) Applicant: Yangtze Memory Technologies Co., Ltd., Hubei (CN)

(72) Inventors: Guangchang Ye, Hubei (CN); Lu Guo, Hubei (CN); Zhongchen Huo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 4 days.

(21) Appl. No.: 17/889,212

(22) Filed: Aug. 16, 2022

(65) Prior Publication Data

US 2024/0061606 A1 Feb. 22, 2024

(51) Int. Cl.
G06F 11/00 (2006.01)
G06F 3/06 (2006.01)

(52) U.S. Cl.
CPC .......... G06F 3/0655 (2013.01); G06F 3/0619 (2013.01); G06F 3/0679 (2013.01)

(58) Field of Classification Search
CPC .... G06F 3/0655; G06F 3/0619; G06F 3/0679; G06F 3/0614; G06F 11/0793; G06F 11/3058; G11C 16/3418; G11C 16/3422
See application file for complete search history.

(56) References Cited

U.S. PATENT DOCUMENTS

| | | | |
|---|---|---|---|
| 2014/0229131 A1* | 8/2014 | Cohen | G11C 16/3495 |
| | | | 702/64 |
| 2016/0004437 A1* | 1/2016 | Kim | G11C 29/021 |
| | | | 714/764 |
| 2019/0354314 A1* | 11/2019 | Hung | G06F 3/0679 |
| 2021/0064277 A1* | 3/2021 | Lang | G11C 7/22 |
| 2021/0082528 A1* | 3/2021 | Takizawa | G11C 16/3477 |
| 2023/0010029 A1* | 1/2023 | Kim | G11C 16/14 |
| 2023/0120696 A1* | 4/2023 | Leem | G11C 11/5642 |
| | | | 711/154 |
| 2024/0028246 A1* | 1/2024 | Troia | G11C 16/349 |

OTHER PUBLICATIONS

Luo, Yixin et al., HeatWatch: Improving 3D NAND Flash Memory Device Reliability by Exploiting Self-Recovery and Temperature Awareness, 2018, IEEE (Year: 2018).*

* cited by examiner

*Primary Examiner* — Marc Duncan
(74) *Attorney, Agent, or Firm* — Conley Rose, P.C.

(57) ABSTRACT

The present disclosure provides a memory system for selecting from among a plurality of read retry routines based on metadata. The memory system can include one or more memory devices and a memory controller. The memory controller can also detect a failure of a read operation. The memory controller can also analyze a set of values that correspond to a set of effectors of the read operation. The memory controller can select one or more read retry routines from a plurality of read retry routines based on the analyzing. Each of the plurality of read retry routines can associated with a different effector from the set of effectors and a read voltage that corresponds to the different effector. The memory controller can also perform the selected one or more read retry routines at the portion of the one or more memory devices to negate the failure of the read operation.

20 Claims, 9 Drawing Sheets

READ RETRY METHOD FOR ENHANCING READ PERFORMANCE AND STABILITY OF 3D NAND MEMORY

TECHNICAL FIELD

The present disclosure generally relates to the field of semiconductor technology, and more particularly, to a method for enhancing read performance in 3D NAND memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

In a 3D NAND flash memory, many layers of memory cells can be stacked vertically such that storage density per unit area can be greatly increased. The vertically stacked memory cells can form memory strings, where the channels of the memory cells are connected in each memory string. Each memory cell can be addressed through a word line and a bit line. Data (i.e., logic states) of the memory cells in an entire memory page sharing the same word line can be read or programmed simultaneously. However, due to aggressive scaling, reliability can be a concern for a 3D NAND flash memory.

BRIEF SUMMARY

Implementations of methods and systems for data protection in a memory device are described in the present disclosure.

The present disclosure describes a memory system used for selecting from among a plurality of read retry routines based on metadata to enhance read operations used by the memory system. In some implementations, the memory system can include one or more memory devices and a memory controller coupled to the one or more memory devices. The one or more memory devices can store data. The memory controller can detect a failure of a read operation performed at a portion of the one or more memory devices. The memory controller can also analyze to a set of values that correspond to a set of effectors of the read operation. The memory controller can also select one or more read retry routines from a plurality of read retry routines based on the analyzing. Each of the plurality of read retry routines can be associated with a different effector from the set of effectors and a read voltage that corresponds to the different effector. The memory controller can also perform the selected one or more read retry routines on the portion of the one or more memory devices to negate the failure of the read operation.

In some implementations, the memory controller can also sense the set of values at the portion of the one or more memory devices. The memory controller can also store the set of values in the memory system based on the sensing. The referring to the set of values can include referring to the stored set of values.

In some implementations, the memory controller can also perform the sensing of the set of values at designated trigger portions of the one or more memory devices.

In some implementations, the sensing of the set of values can include assigning a time stamp to a past programming event at the portion of the one or more memory devices.

In some implementations, the sensing of the set of values can include sensing a temperature at the portion of the one or more memory devices.

In some implementations, the sensing of the set of values can include logging a read count at the portion of the one or more memory devices.

In some implementations, the memory controller can also include a non-transitory storage medium to store the plurality of read retry routines.

In some implementations, the one or more memory devices can include a three-dimensional (3D) NAND memory device.

In some implementations, the set of values of effectors can include a time stamp of a past programming event at the portion of the one or more memory devices. The selected one or more read retry routines can include a read retry routine that uses a read voltage that corresponds to a time-based effector of the read operation.

In some implementations, the set of values of effectors can include a temperature at the portion of the one or more memory devices. The selected one or more read retry routines can include a read retry routine that uses a read voltage that corresponds to a temperature-based effector of the read operation.

In some implementations, the set of values of effectors can include a read count at the portion of the one or more memory devices. The selected one or more read retry routines can include a read retry routine that uses a read voltage that corresponds to a read-count-based effector of the read operation.

The present disclosure provides an operation method for selecting from among a plurality of read retry routines based on metadata to enhance read operations in a memory system. In some implementations, the operation method can include storing data in one or more devices of the memory system. The operation method can also include detecting a failure of a read operation performed at a portion of the one or more memory devices. The operation method can also include analyzing a set of values that correspond to a set of effectors of the read operation. The operation method can also include selecting one or more read retry routines from a plurality of read retry routines based on the analyzing. Each of the plurality of read retry routines can be associated with a different effector from the set of effectors and a read voltage that corresponds to the different effector. The operation method can also include performing the selected one or more read retry routines at the portion of the one or more memory devices to negate the failure of the read operation.

In some implementations, the operation method can also include sensing the set of values at the portion of the one or more memory devices. The operation method can also include storing the set of values in the memory system based on the sensing. The referring to the set of values can include referring to the stored set of values.

In some implementations, the operation method can also include performing the sensing of the set of values at designated trigger portions of the one or more memory devices.

In some implementations, the sensing of the set of values can include assigning a time stamp to a past programming event at the portion of the one or more memory devices.

In some implementations, the sensing of the set of values comprises can include a temperature at the portion of the one or more memory devices.

In some implementations, the sensing of the set of values can include logging a read count at the portion of the one or more memory devices.

In some implementations, the operation method can also include storing instructions for executing the plurality of read retry routines at a non-transitory storage medium of a memory controller.

In some implementations, the set of values of effectors can include a time stamp of a past programming event at the portion of the one or more memory devices. The selected one or more read retry routines can include a read retry routine that uses a read voltage that corresponds to a time-based effector of the read operation.

In some implementations, the set of values of effectors can include a temperature at the portion of the one or more memory devices. The selected one or more read retry routines can include a read retry routine that uses a read voltage that corresponds to a temperature-based effector of the read operation.

In some implementations, the set of values of effectors can include a read count at the portion of the one or more memory devices. The selected one or more read retry routines can include a read retry routine that uses a read voltage that corresponds to a read-count-based effector of the read operation.

The present disclosure provides a memory system for selecting from among a plurality of read retry routines based on metadata to enhance read operations in the memory system. The memory system can include a memory controller coupled to one or more memory devices. The memory system can also include a non-transitory computer-readable medium. The non-transitory computer-readable medium can include instructions stored thereon, that, when executed by the memory controller, can cause the one or more computing devices to perform operations of the operation method described above.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate implementations of the present disclosure and, together with the description, further serve to explain the principles of the present disclosure and to enable a person skilled in the pertinent art to make and use the present disclosure.

Figure 1:
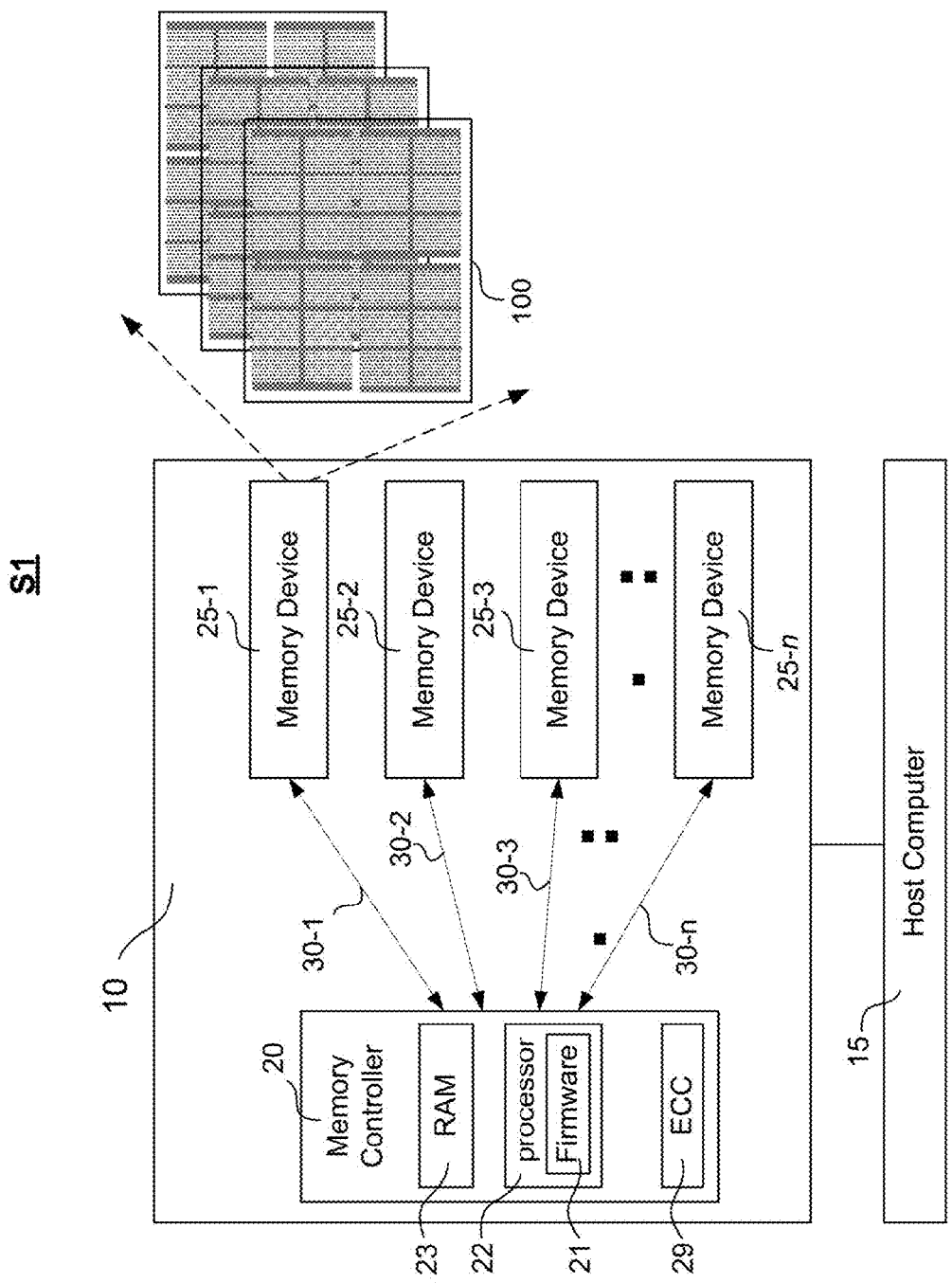
FIGS. 1 and 2A-2B illustrate a storage system with one or more memory devices, according to some implementations.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Implementations of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one implementation," "an implementation," "an example implementation," "some implementations," etc., indicate that the implementation described can include a particular feature, structure, or characteristic, but every implementation may not necessarily include the particular feature, structure, or characteristic. Moreover, such phrases do not necessarily refer to the same implementation. Further, when a particular feature, structure or characteristic is described in connection with an implementation, it would be within the knowledge of a person skilled in the pertinent art to affect such feature, structure, or characteristic in connection with other implementations whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context. It should be readily understood that the meaning of "a set of" elements can refer to one or more than one of the elements.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a block diagram of a system Si having a memory system 10, according to some implementations. In some implementations, system Si can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Memory system 10 (e.g., a NAND memory system) can include a memory controller 20 and one or more semiconductor memory devices 25-1, 25-2, 25-3, . . . , 25-n. Each semiconductor memory device 25 (hereafter just "memory device") can be a NAND chip (e.g., "flash," "NAND flash" or "NAND"). Memory system 10 can communicate with a host computer 15 through memory controller 20, where memory controller 20 can be connected to one or more memory devices 25-1, 25-2, 25-3, . . . , 25-n, via one or more memory channels 30-1, 30-2, 30-3, . . . , 30-n. In some implementations, each memory device 25 can be managed by memory controller 20 via one or more memory channels 30-1, 30-2, 30-3, . . . , 30-n.

In some implementations, host computer 15 can include a processor of an electronic device, such as a central processing unit (CPU), or a system-on-chip (SoC), such as an application processor (AP). Host computer 15 can send data to be stored at memory system 10 and/or can retrieve data from stored in memory system 10.

In some implementations, memory controller 20 can handle I/O requests received from host computer 15, ensure data integrity and efficient storage, and manage memory device 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory device 25 (e.g., actual locations where the data is stored). Controller 20 also runs firmware 21 to manage defective memory blocks in the memory device 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some implementations, the memory controller 20 can also perform error recovery through an error correction code (ECC) engine 29. ECC is used to detect and correct the raw bit errors that occur within each memory device 25.

In some implementations, the memory channels 30 can provide data and control communication between the memory controller 20 and each memory device 25 via a data bus. The memory controller 20 can select one of the memory device 25 according to an enable signal.

In some implementations, each memory device 25 in FIG. 1 can include one or more memory dies 100, where each memory die can be a 3D NAND memory.

Figure 2A:
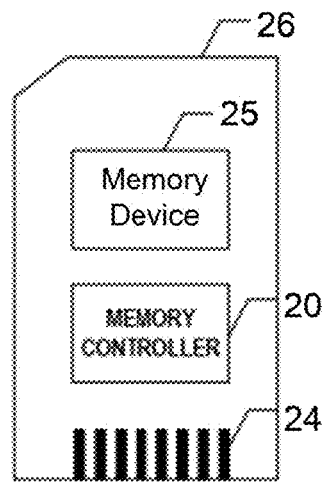
Figure 2B:
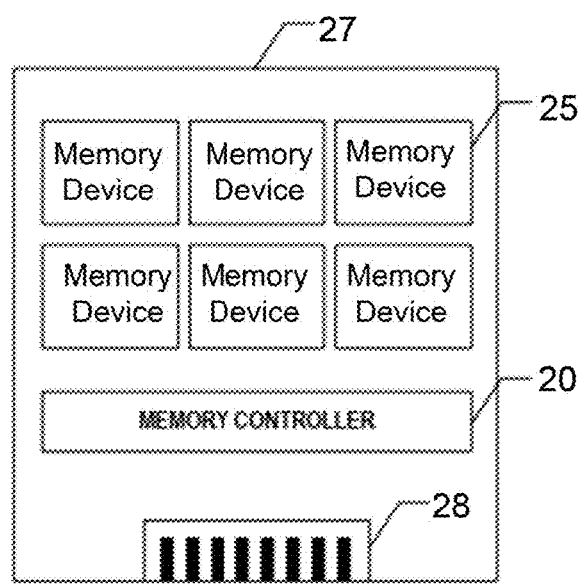

In some implementations, memory controller 20 and one or more memory device 25 can be integrated into various types of storage devices, for example, be included in the same package, such as a universal Flash storage (UFS) package or an eMMC package. That is, memory system 10 can be implemented and packaged into different types of end electronic products. In one example as shown in FIG. 2A, memory controller 20 and a single memory device 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, mini SD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory device 25 can be integrated into a solid state drive (SSD) 27. SSD 27 can further include a SSD connector 28 coupling SSD 27 with a host (e.g., the host computer 15 in FIG. 1).

Figure 3:
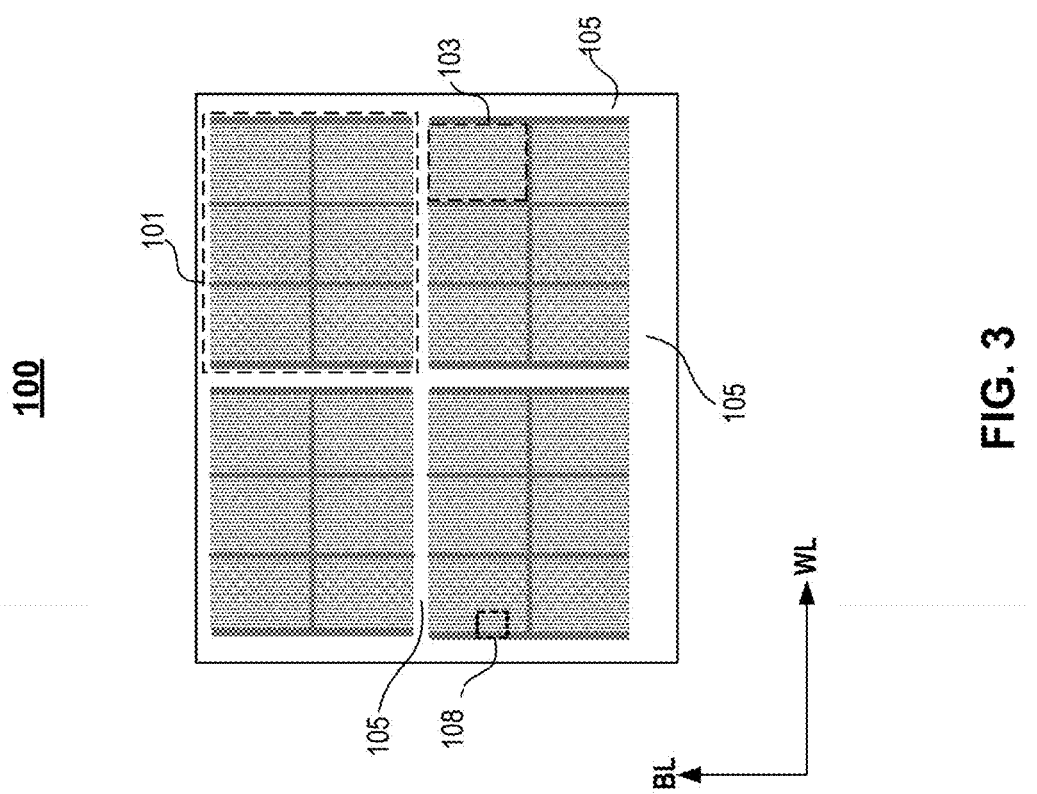
FIG. 3 illustrates a schematic diagram of a memory die, according to some implementations.

FIG. 3 illustrates a top-down view of a memory die 100, according to some implementations. The example configuration shown in FIG. 3 is given as a non-limiting example and it is to be appreciated that memory is scalable. In some implementations, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

In some implementations, memory die 100 can also include a periphery circuit region 105, an area surrounding memory planes 101. The periphery circuit region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In another implementations, periphery circuit region 105 in the memory die 100 does not surround memory planes 101, but can be disposed under memory planes 101 by bonding a first wafer for forming periphery circuit region 105 and a second wafer for forming memory planes 101 together.

In some implementations, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
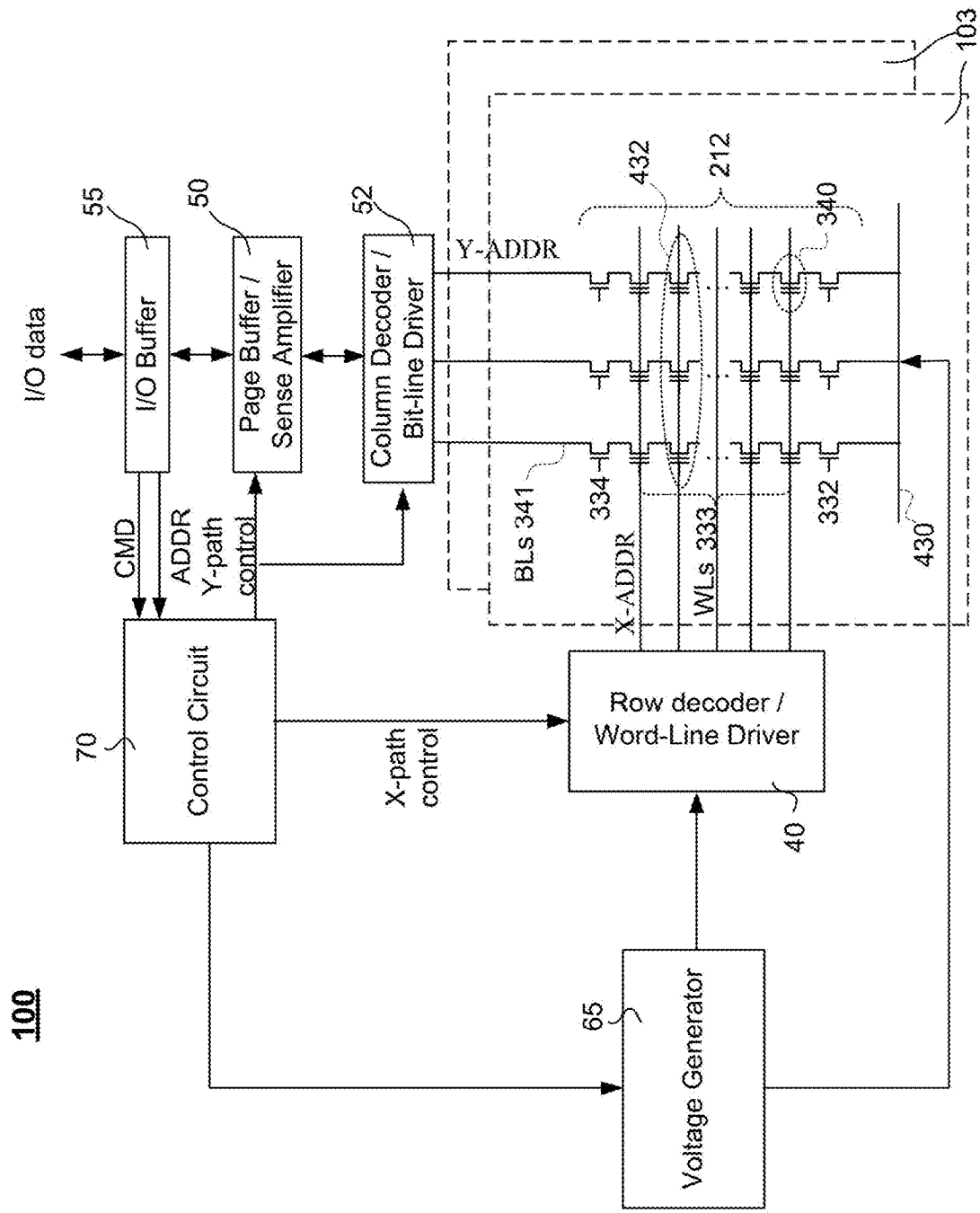
FIG. 4 illustrates a schematic of a three-dimensional (3D) memory die, according to some implementations.

FIG. 4 illustrates a schematic diagram of the memory die 100, according to some implementations. In some implementations, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some implementations, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a control circuit 70, a voltage generator 65 and an input/output buffer 55. These circuits can include active and/or passive semiconductor devices, such as transistors, diodes, capacitors, resistors, etc., as would be apparent to a person of ordinary skill in the art.

In some implementations, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to a X-path control signal provided by the control circuit 70. Rrow decoder/word line driver 40 can transfer voltages provided from the voltage generator 65 to the word lines according to the X-path control signal. During the read and program operation, the row decoder/word line driver 40 can transfer a read voltage Vread and a program voltage $V_{pgm}$ to a selected word line and a pass voltage Vpass to an unselected word line according to the X-path control signal received from the control circuit 70.

In some implementations, column decoder/bit line driver 52 can transfer an inhibit voltage $V_{inhibit}$ to an unselected bit line and connect a selected bit line to ground according to a Y-path control signal received from control circuit 70. In the other words, column decoder/bit line driver 52 can be configured to select or unselect one or more memory strings 212 according to the Y-path control signal from control circuit 70. The page buffer/sense amplifier 50 can be configured to read and program (write) data from and to the memory block 103 according to the Y-path control signal control from the control circuit 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some implementations, input/output buffer 55 can transfer the I/O data from/to the page buffer/sense amplifier 50 as well as addresses ADDR or commands CMD to the control circuit 70. In some implementations, input/output buffer 55 can function as an interface between memory controller 20 (in FIG. 1) and memory die 100 on memory device 25.

In some implementations, control circuit 70 can control page buffer/sense amplifier 50 and row decoder/word line driver 40 in response to the commands CMD transferred by the input/output buffer 55. During the program operation, control circuit 70 can control row decoder/word line driver 40 and page buffer/sense amplifier 50 to program a selected memory cell. During the read operation, control circuit 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some implementations, voltage generator 65 can generate voltages to be supplied to word lines and bit lines under the control of control circuit 70. The voltages generated by voltage generator 65 include the read voltage Vread, the program voltage $V_{pgm}$, the pass voltage Vpass, the inhibit voltage $V_{inhibit}$, etc.

It is noted that the arrangement of the electronic components in the memory system 10 and the memory die 100 in FIGS. 1, 2A-2B, and 3-4 are shown as non-limiting examples. In some implementations, memory system 10 and memory die 100 can have other layout and can include additional components. Components (e.g., control circuit 70, I/O buffer 55) on memory die 100 shown in FIG. 4 can also be moved off memory die 100, as a stand-alone electric component in the memory system 10. Components (e.g., control circuit 70, I/O buffer 55) on memory die 100 shown in FIG. 4 can also be moved to other components in memory system 10, for example, a portion of control circuit 70 can be combined with memory controller 20 and vice versa.

Figure 5:
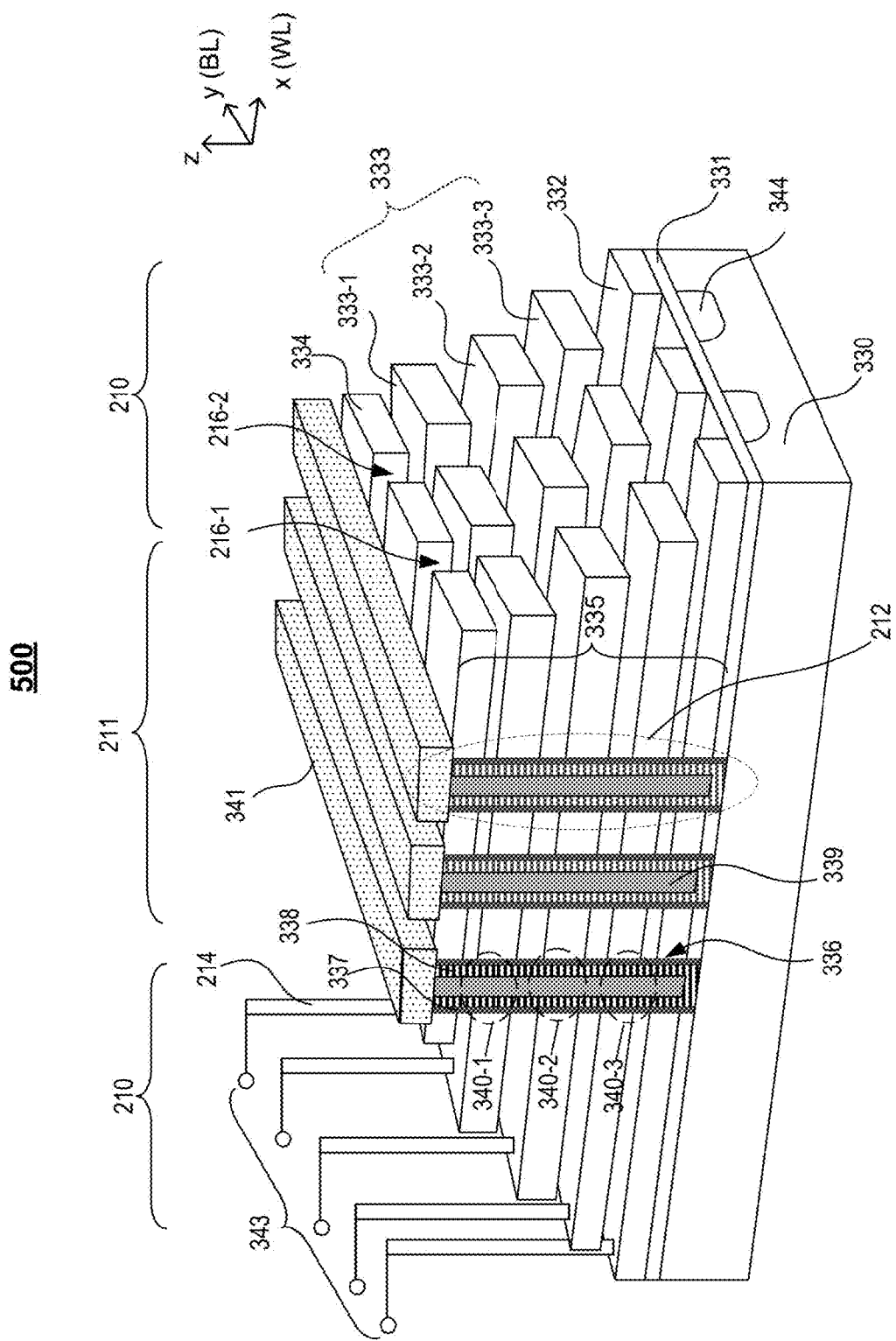
FIG. 5 illustrates a perspective view of a portion of a 3D memory structure, in accordance with some implementations.

FIG. 5 illustrates a perspective view of a 3D memory structure 500, according to some implementations. In some implementations, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some implementations, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some implementations, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some implementations, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some implementations, memory block 103 can be formed based on floating gate technology. In some implementations, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some implementations, in a NAND flash memory, a read operation and a write operation (also referred to as program operation) can be performed for the memory page 432, and an erase operation can be performed for the memory block 103.

In some implementations, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage $V_{th}$ of memory cells 340 can be reset to the lowest value.

In some implementations, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some implementations, the state of the memory cell (e.g., state ER or state P1) can be determined by measuring or sensing the threshold voltage $V_{th}$ of the memory cell. During a read operation, a read voltage Vread can be applied on control gate 333 of the memory cell and current flowing through the memory cell can be measured at bit line 341. A pass voltage Vpass can be applied on unselected word lines to switch on unselected memory cells.

In some implementations, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states ("states"), logic {1 and 0}, i.e., states ER and P1. In the MLC mode, a memory cell stores 2 bits, and has four logic states, logic {11, 10, 01, and 00}, i.e., states ER, P1, P2, and P3. In the TLC mode, a memory cell stores 3 bits, and has eight logic states, logic {111, 110, 101, 100, 011, 010, 001, 000}, i.e., states ER, and states P1-P7. In the QLC mode, a memory cell stores 4 bits and has 16 logic states. Memory controller 20 of memory system 10 (see FIG. 1) can convert data received from host computer 15 into corresponding logic states of the memory cells on memory dies 100 and vice versa.

Figure 6:
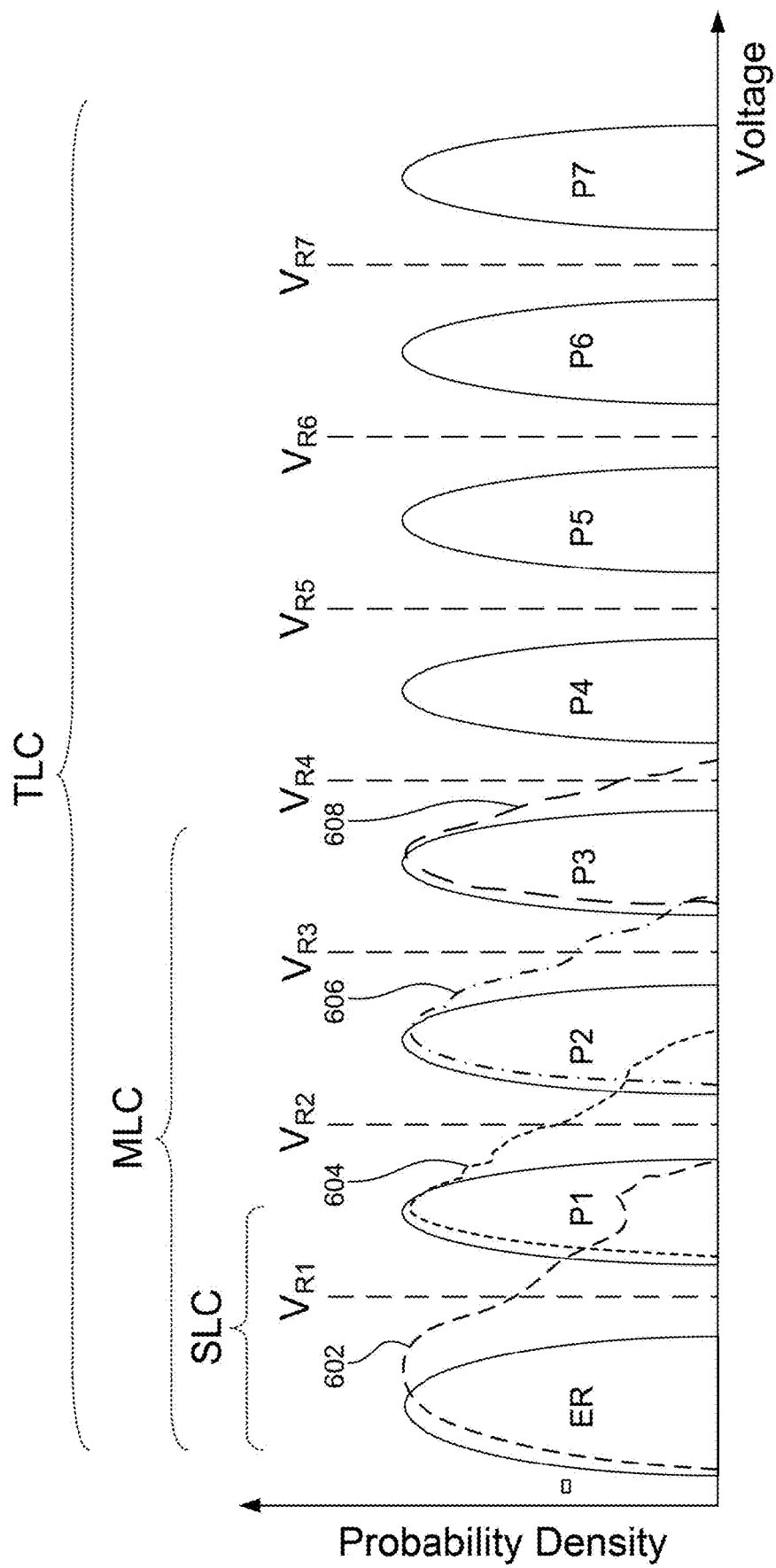
FIG. 6 illustrates a threshold voltage $V_{th}$ distribution of a NAND flash memory, according to some implementations.

FIG. 6 illustrates a threshold voltage $V_{th}$ distribution of a NAND flash memory programmed in the triple-level cell (TLC) mode, according to some implementations. In some implementations, each state of the memory cells can correspond to a specific range of threshold voltage $V_{th}$, where the threshold voltage $V_{th}$ distribution of each state can be represented by a probability density. In some implementations, the eight TLC states can be programmed by using an incremental step pulse programming (ISPP) scheme where the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage.

In some implementations, after programming, the eight TLC states ER and P1-P7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

In some implementations, as described above, to determine the two states ER and P1 stored in the SLC mode, it is sufficient to rely on just the read reference voltage $V_{R1}$. To determine the four states ER and P1-P3 in the MLC mode, the read reference voltages $V_{R1}$, $V_{R2}$ and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 is between $V_{R1}$ and $V_{R2}$. States P2-P6 can be determined similarly.

In some implementations, it is desirable to provide reliable and expedient reading operations to retrieve programmed data from memory cell(s). In practice, undesirable electronic behavior in a 3D NAND memory can cause a read operation to fail. The likelihood of read error can increase as layers increase (e.g., from SLC to MLC or TLC). Referring again to FIG. 6, some conditions (e.g., change in temperature) of a 3D NAND memory can disturb the distributions of threshold voltages. For example, the distribution of threshold voltages for state ER can be disturbed as shown by distribution 602. Higher states can also be similarly disturbed. FIG. 6 shows non-limiting examples of deformations of threshold voltage distributions 604, 606, and 608 corresponding to distributions for states P1, P2, and P3 (higher states can be similarly affected). If the impact to the threshold voltage distributions is prominent enough, then the read operation can fail (e.g., reads an incorrect value, different from the value that was programmed in the memory cell).

In some implementations, memory system 10 (FIG. 1), or subcomponents thereof, can undergo a power cycle (e.g., power down, sleep mode, wake up, or the like). When powered down or operating on limited power, memory cell(s) of the 3D NAND memory can undergo a substantial change in temperature (e.g., from well-above room temperature to near room temperature. In one non-limiting example, operating temperature can be approximately 70-100° C. and room temperature can be approximately 20-30° C. (can change depending on ambient conditions). When the 3D NAND is powered back on, the difference in temperature can impact the threshold voltage distribution. It is noted that read fails can fail in the above-noted manner even when the programmed data in the memory cell is uncorrupted. In such cases, the programmed data is not lost and the read operation can be modified and/or retried to retrieve the programmed data.

In some implementations, a method to address read errors can include performing a set of read retry routines. An exemplary read retry routine can include merely repeating the read operation that resulted in the read fail. Alternatively, a somewhat more complex read retry routines can include modified versions of the read operation that address different effectors of the read operation. Effectors of a read operation can include phenomena that impact a read operation. Effectors of read operations can include, for example, time elapsed since the last programming of a memory cell, time elapsed since a previous read operation, a temperature of the memory cell, time elapsed since a previous temperature check, number of reads previously performed on the memory cell, or the like. Those skilled in the art will appreciate that that other effectors of read operations are envisaged. Read retry attempts can be optimized for different conditions of a 3D NAND memory. The optimization can be based on collection of metadata of various aspects of the 3D NAND memory (e.g., time stamp, temperature, read disturb, or the like).

Figure 7:
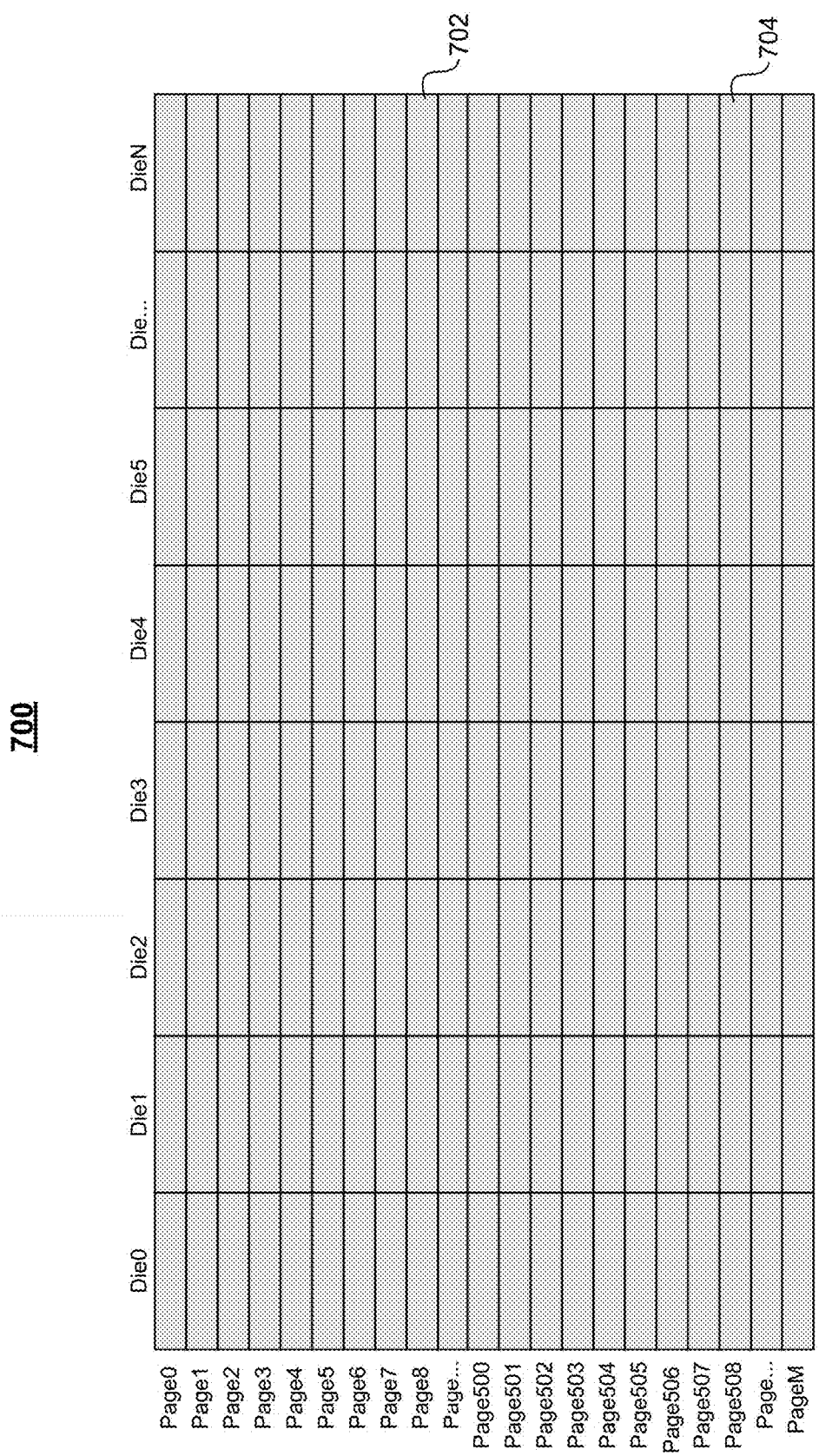
FIG. 7 illustrates a chart of pages and dies of a 3D NAND memory, according to some implementations.

FIG. 7 illustrates a chart of pages and dies of a 3D NAND memory 700, according to some implementations. In some implementations, 3D NAND memory 700 can be another representation of memory system 10 (FIG. 1). Unless otherwise noted, structures and functions described previously for elements of FIG. 1 (as well as other related figures) can also apply to similar elements described in reference to FIG. 7.

In some implementations, 3D NAND memory 700 can include a plurality of dies (e.g., memory die 100 (FIGS. 1, 3, 4)). Each die is labeled Die-n, where n goes from 0 to N. Each die can include a plurality of pages (e.g., memory page 432 (FIG. 4)). Each page is labeled Page-m, where m goes from 0 to M. Sensing and storing metadata from each of the m pages in each of the n dies may take a significant amount of time and storage space. Implementations described herein are directed to improving read speeds and operating efficiency of NAND memory devices. Therefore, in some implementations, sensing and storing metadata can be set to occur at designated trigger portions of 3D NAND memory 700. For example, a given page of a given die can be chosen as a trigger point. The association of a given page as a trigger point can be programmed in, for example, firmware 21 (FIG. 1). FIG. 7 shows trigger points 702 and 704 as non-limiting examples. In general, a plurality of portions of 3D NAND memory 700 can be associated with corresponding trigger points.

In some implementations, an operation can be performed at trigger points 702 and/or 704 (e.g., also "trigger portions of the NAND memory system or devices" or "designated trigger portions"). The operation can be, for example, a read operation (sensing data stored in a page) or a programming operation (programming data into a page). Since the read/programming operation has encountered a trigger point, one or more effectors of read/programming operation can be sensed and recorded.

Figure 8:
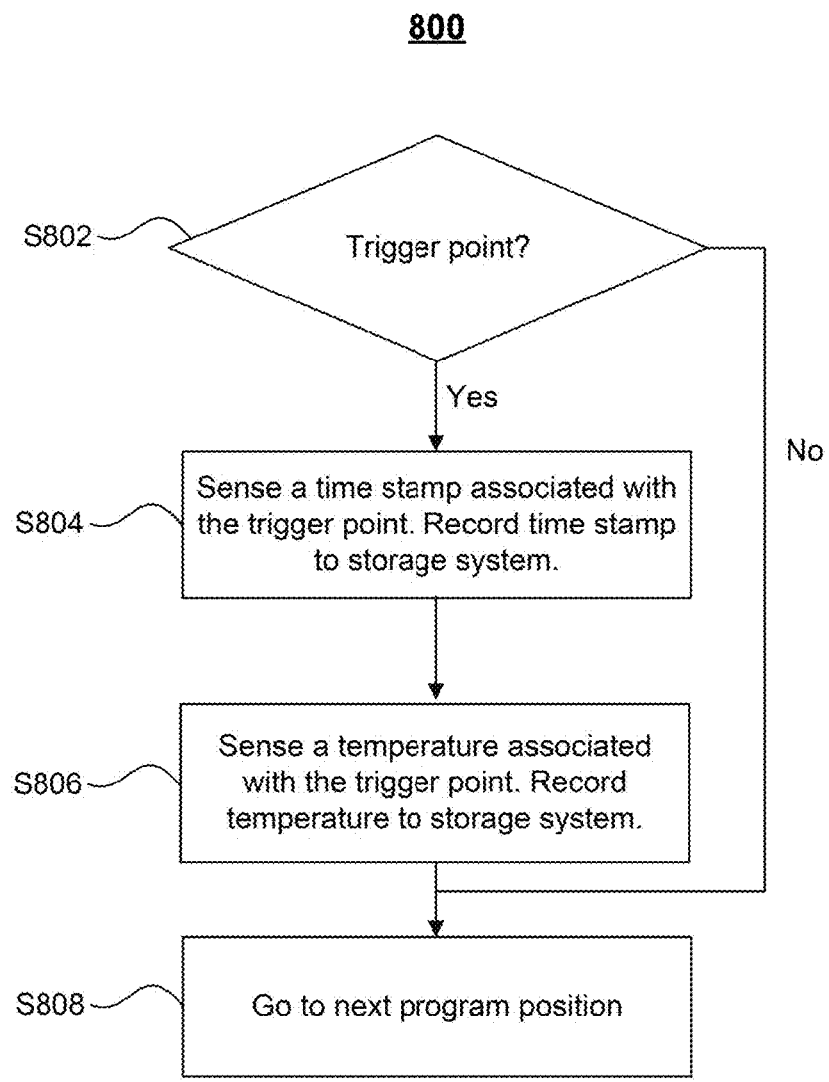
FIG. 8 illustrates a method for sensing a set of values of effectors of a read operation, according to some implementations.

FIG. 8 illustrates a method 800 for sensing a set of values of effectors of a read operation, according to some implementations. In some implementations, the read operation can be one that is performed at a portion of a data storage system (e.g., memory system 10 (FIG. 1)) comprising 3D NAND memory (e.g., 3D NAND memory 700 (FIG. 7)).

In some implementations, at step S802, method 800 can include checking if an operation is to interact with a trigger point (e.g., trigger point 702 FIG. 7). As described previously, the checking can be triggered when a read or programming operation is performed at the portion of the 3D NAND memory that is associated with a trigger point. If yes, at step S804, method 800 can include sensing and recording a time stamp that is associated with the trigger point. The trigger point can be, for example, a portion of the 3D NAND memory (e.g., a location associated with (n, m) as defined in reference to FIG. 7). For example, the trigger point can be a given page, block, super block (e.g., a plurality of blocks), or the like. The time stamp can also be associated with a programming event, a temperature sensing event, a read event, and/or the like.

In some implementations, at step S806, method 800 can include sensing and recording a temperature that is associated with the trigger point (e.g., at a given portion of the 3D NAND memory). If step S802 checks for a trigger point and finds that it is not a trigger point, then method 800 can skip to step S808 and proceed operation(s) at the next position (e.g., proceed to the next page).

In some implementations, if the operation being performed at the trigger point is a read operation, then method 800 can include logging the read event (e.g., keeping track of the number of read counts performed on a particular portion of the 3D NAND memory). Read operations may slightly disturb a memory cell (e.g., read disturb). A high number of read counts may aggregate the disturbance to a memory cell.

In some implementations, the sensed values for the different effectors of a read operation can be recorded in RAM 23 (FIG. 1) as metadata.

Figure 9:
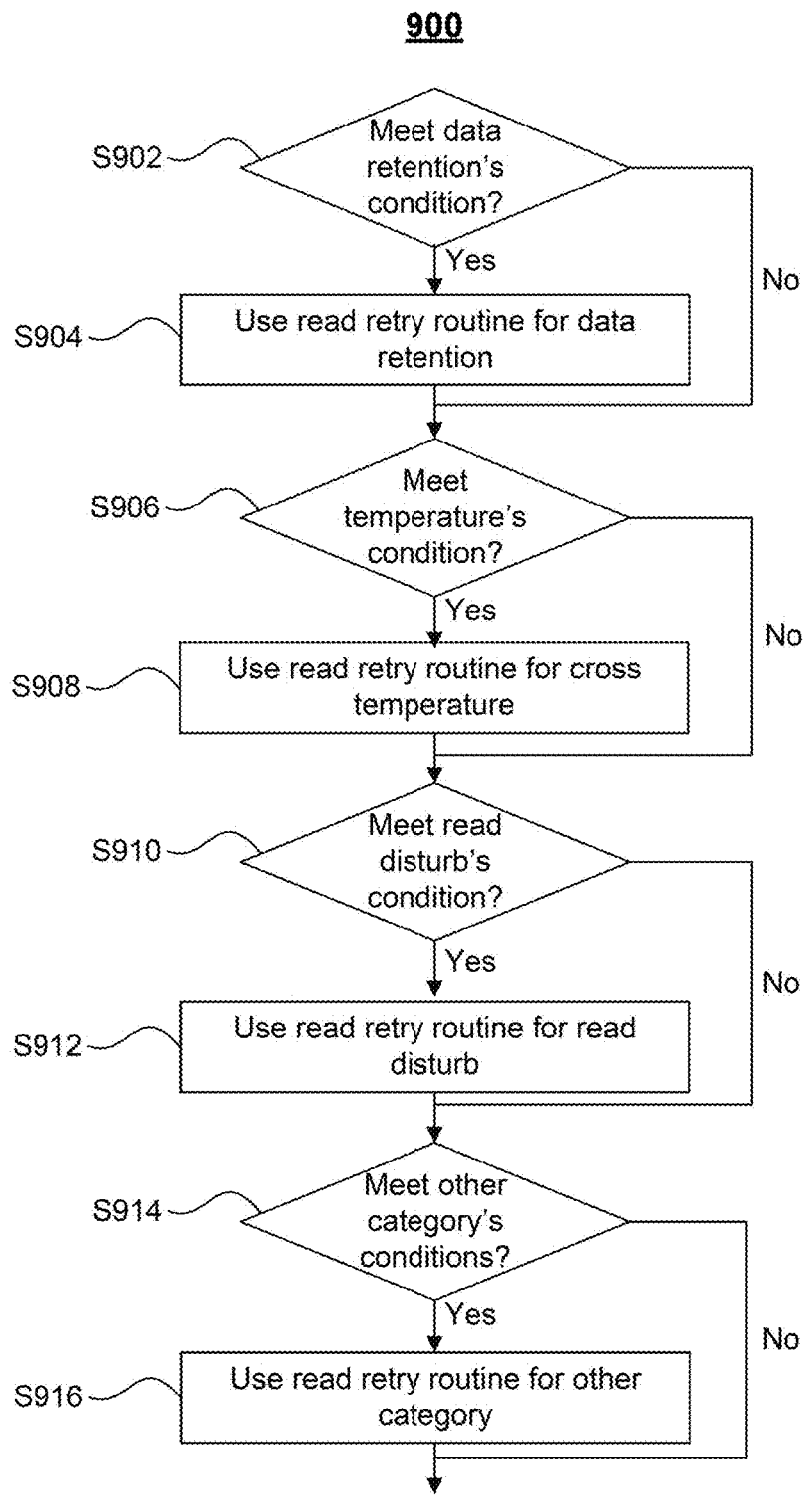
FIG. 9 illustrates a method for selecting from a plurality of read retry routines, according to some implementations.

FIG. 9 illustrates a method 900 for selecting from a plurality of read retry routines, according to some implementations. In some implementations, the selection from the plurality of read retry routines, and subsequent execution, can performed based on the metadata collected using method 800. In some implementations, the steps of method 900 can be triggered, for example, when a read operation has failed. The steps of method 900 can access and compare metadata associated with a trigger point closest to a portion of a 3D NAND memory where the read operation failed (e.g., trigger point 702 FIG. 7). A set of values of effectors of a read operation—stored as metadata (e.g., in a list or table)—can include a time stamp, temperature, read count, other effector(s), or a combination thereof.

In some implementations, when the standard read operation fails, a read retry routine may be used. Read retry routines may comprise modified read operations for read reattempts that are specific for overcoming the different failure conditions of the standard read operation (e.g., failure due to temperature, failure due to read disturb, or the like).

In some implementations, at step S902, method 900 can include checking or determining if a set of data retention conditions has been met. The term "data retention" can refer to a capability of a memory cell to retain its data. Over time, electrons can leak (e.g., electron tunneling) to or from a charge trap layer (e.g., memory film 337 (FIG. 4)). The electron leak can cause the programmed distributions (see e.g., FIG. 6) to widen and/or shift. To account for this effect, a read retry based on data retention metadata can use an adjusted read voltage for the read retry, as opposed to performing a regular read retry with an unadjusted read voltage.

In some implementations, memory controller 20 (FIG. 1) can analyze a length of time that has elapsed since the last operation performed at a memory cell associated with the trigger point (e.g., comparing a present time to a time stamp from the metadata). If the set of data retention conditions are not met, method 900 can skip step S904. If the set of data retention conditions are met, method 900 can proceed to step S904, which is to select one of the plurality of read retry routines associated with data retention (e.g., using a an adjusted read voltage). The selected one of the plurality of read retry routines of step S904 can include a read operation based on the time stamp associated with a portion of memory system 10 (FIG. 1) (e.g., the read voltage adjustment can be based on the time stamp). The portion of the memory system can be, e.g., trigger point 702 (FIG. 7). The read retry routine can include, for example, a read operation that includes an adjusted pre-pulse duration different from the pre-pulse duration used in the failed read operation.

In some implementations, the parameter(s) of the read retry based on data retention can be determined based on large scale experiments (e.g., at factory). For example, a large sample of memory devices and memory cells can be tested to determine an optimal read voltages (adjusted read voltages) to use for a memory cells retaining data for approximately 1 year, 2 years, 3 years, and so on. The tests can be further refined with temperature data. For example, optimal read voltages can be determined for memory cells at a temperature of 40° C. retaining data for 1 year, a temperature of 55° C. retaining data for 1 year, 40° C. retaining data for 3 years, a temperature of 55° C. retaining data for 3 years, or the like. The resulting voltage adjustments and trigger conditions (e.g., data retention conditions) can be stored in a non-transitory storage medium of memory controller 20 (FIG. 1) or in a page of the NAND memory device.

In some implementations, at step S906, method 900 can include checking if a set of temperature conditions has been met. For example, a parameter of concern can be a temperature difference. An example of temperature difference can be based on a program operation performed on a memory cell having an elevated temperature compared to a read operation performed on the memory cell while the memory cell is at a temperature lower than the elevated temperature. Another example can be a program operation performed on a memory cell having a low temperature compared to a read operation performed on the memory cell while the memory cell is at an elevated temperature. Other temperature difference scenarios are envisaged. The temperature difference can cause the programmed distributions (see e.g., FIG. 6) to widen and/or shift. To account for this effect, a read retry based on temperature conditions metadata can use an adjusted read voltage specifically tailored for temperature conditions, as opposed to performing a regular read retry with an unadjusted read voltage.

In some implementations, memory controller 20 (FIG. 1) can record a temperature of a memory cell (e.g., at a trigger point) when the memory cell is programmed. At a later time when reading back the data from the memory cell, memory controller 20 (FIG. 1) can analyze a present temperature of the memory cell and the earlier recorded programming temperature by comparing to the set of temperature conditions associated with the trigger point. If the set of temperature conditions are not met, method 900 can skip step S908. If the set of temperature conditions are met, method 900 can proceed with step S908, which is to select one of the plurality of read retry routines associated with temperature. The selected one of the plurality of read retry routines of step S908 can include a read operation based on the recorded temperature associated with a portion of memory system 10 (FIG. 1) (e.g., a trigger point 702 (FIG. 7)).

In some implementations, the parameter(s) of the read retry based on temperature conditions can be determined based on large scale experiments (e.g., at factory). For example, a large sample of memory devices and memory cells can be tested to determine an optimal read voltages (adjusted read voltages) to use for a memory cells that have a range of temperature differences associated with program operations and read operations. The resulting voltage adjustments and trigger conditions (e.g., temperature conditions) can be stored in a non-transitory storage medium of memory controller 20 (FIG. 1) or in a page of the NAND memory device.

In some implementations, at step S910, method 900 can include checking if a set of read disturb conditions has been met. For example, reading on NAND pages on the same physical block can be performed many times. This can cause the programmed distributions (see e.g., FIG. 6) to shift. To account for this effect, a read retry based on read disturb metadata can use an adjusted read voltage specifically tailored for different magnitudes of read distrubances, as opposed to performing a regular read retry with an unadjusted read voltage.

In some implementations, memory controller 20 (FIG. 1) can record a count when a read operation is performed on a memory cell (e.g., at a trigger point). At a later time when reading back the data from the memory cell, memory controller 20 (FIG. 1) can analyze a recorded read count associated with the trigger point. Erase counts can also be used. If the set of read disturb conditions are not met, method 900 can skip step S912. If the set of read disturb conditions are met, method 900 can proceed with step S912, which is to select one of the plurality of read retry routines associated with read disturb. In this scenario, the selected one of the plurality of read retry routines can include a read operation based on the recorded read count associated with a portion of memory system 10 (FIG. 1) (e.g., a trigger point 702 (FIG. 7)).

In some implementations, the parameter(s) of the read retry based on read disturb can be determined based on large scale experiments (e.g., at factory). For example, a large sample of memory devices and memory cells can be tested to determine an optimal read voltages (adjusted read voltages) to use for a memory cells that have a read count of 3000, a read count of 10000, or the like. Erase counts can also be used. The resulting voltage adjustments and trigger conditions (e.g., read disturb conditions) can be stored in a non-transitory storage medium of memory controller 20 (FIG. 1) or in a page of the NAND memory device.

In some implementations, at step S914, method 900 can include checking if a given set of other category of conditions has been met. For example, the routine can analyze a recorded time stamp and temperature associated with the trigger point. If the given set of the other category's conditions are not met, method 900 can skip step S916. If the given set of the other category's conditions are met, method 900 can proceed with step S916, which is to select one of the plurality of read retry routines associated with the other category. In this scenario, the selected one of the plurality of read retry routines can include a read operation based on the metadata associated with the other category at a portion of memory system 10 (FIG. 1) (e.g., a trigger point 702 (FIG. 7)). The read operation in step S916 can have one or more parameters that are different from the read operation(s) in step S904, S908, and/or S912.

In some implementations, by using method 900 to select read retry routines, a performance of a data storage system, such as an enterprise-class solid-state drive, can be significantly enhanced. In comparison, a data storage system that does not use metadata related methods, it is possible that all read retry routines would need to be used or even a randomized selection from read retry routines, which can severely impact read back speeds and increase read latency.

The method steps in implementations disclosed herein can be performed in any conceivable order and it is not required that all steps be performed.

In summary, the present disclosure describes a memory system used for selecting from among a plurality of read retry routines based on metadata to enhance read operations used by the memory system. In some implementations, the memory system can include one or more memory devices and a memory controller coupled to the one or more memory devices. The one or more memory devices can store data. The memory controller can detect a failure of a read operation at a portion of the one or more memory devices. The memory controller can also analyze to a set of values that correspond to a set of effectors of the read operation. The memory controller can also select one or more read retry routines from a plurality of read retry routines based on the analyzing. Each of the plurality of read retry routines can be associated with a different effector from the set of effectors and a read voltage that corresponds to the different effector. The memory controller can also perform the selected one or more read retry routines on the portion of the one or more memory devices to negate the failure of the read operation.

The present disclosure also provides an operation method for selecting from among a plurality of read retry routines based on metadata to enhance read operations in a memory system. In some implementations, the operation method can include storing data in one or more devices of the memory system. The operation method can also include detecting a failure of a read operation performed at a portion of the one or more memory devices. The operation method can also include analyzing a set of values that correspond to a set of effectors of the read operation. The operation method can also include selecting one or more read retry routines from a plurality of read retry routines based on the analyzing each of the plurality of read retry routines is associated with a different effector from the set of effectors and a read voltage that corresponds to the different effector. The operation method can also include performing the selected one or more read retry routines at the portion of the one or more memory devices to negate the failure of the read operation.

The present disclosure further provides a memory system for selecting from among a plurality of read retry routines based on metadata to enhance read operations in the memory system. The memory system can include a memory controller coupled to one or more memory devices. The memory system can also include a non-transitory computer-readable medium. The non-transitory computer-readable medium can include instructions stored thereon, that, when executed by the memory controller, can cause the one or more computing devices to perform operations of the operation method described above.

The foregoing description of the specific implementations will so fully reveal the general nature of the present disclosure that others can, by applying knowledge within the skill of the art, readily modify and/or adapt, for various applications, such specific implementations, without undue experimentation, and without departing from the general concept of the present disclosure. Therefore, such adaptations and modifications are intended to be within the meaning and range of equivalents of the disclosed implementations, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Implementations of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary implementations of the present disclosure as contemplated by the inventor(s), and thus, are not intended to limit the present disclosure and the appended claims in any way.

Other aspects of the present disclosure are set-out as in the following numbered clauses:

1. A memory system, comprising:
   one or more memory devices configured to store data; and
   a memory controller coupled to the one or more memory devices and configured to:
      detect a failure of a read operation performed at a portion of the one or more memory devices;
      analyze a set of values that correspond to a set of effectors of the read operation;
      select one or more read retry routines from a plurality of read retry routines based on the analyzing, wherein each of the plurality of read retry routines is associated with
         a different effector from the set of effectors, and
         a read voltage that corresponds to the different effector; and
      perform the selected one or more read retry routines at the portion of the one or more memory devices to negate the failure of the read operation.
2. The memory system of clause 1, wherein the memory controller is further configured to:
   sense the set of values at the portion of the one or more memory devices; and
   store the set of values in the memory system based on the sensing.
3. The memory system of clause 2, wherein the memory controller is further configured to perform the sensing of the set of values at designated trigger portions of the one or more memory devices.
4. The memory system of clause 2, wherein the sensing of the set of values comprises assigning a time stamp to a past programming event at the portion of the one or more memory devices.
5. The memory system of clause 2, wherein the sensing of the set of values comprises sensing a temperature at the portion of the one or more memory devices.
6. The memory system of clause 2, wherein the sensing of the set of values comprises logging a read count at the portion of the one or more memory devices.
7. The memory system of clause 1, wherein the memory controller comprises a non-transitory storage medium configured to store the plurality of read retry routines.
8. The memory system of clause 1, wherein the one or more memory devices comprise a three-dimensional (3D) NAND memory device.
9. The memory system of clause 1, wherein:
   the set of values of effectors comprises a time stamp of a past programming event at the portion of the one or more memory devices; and
   the selected one or more read retry routines comprises a read retry routine that uses a read voltage that corresponds to a time-based effector of the read operation.
10. The memory system of clause 1, wherein:
   the set of values of effectors comprises a temperature at the portion of the one or more memory devices; and
   the selected one or more read retry routines comprises a read retry routine that uses a read voltage that corresponds to a temperature-based effector of the read operation.
11. The memory system of clause 1, wherein:
   the set of values of effectors comprises a read count at the portion of the one or more memory devices; and
   the selected one or more read retry routines comprises a read retry routine that uses a read voltage that corresponds to a read-count-based effector of the read operation.
12. An operation method of a memory system comprising:
   storing data in one or more memory devices of the memory system;
   detecting a failure of a read operation performed at a portion of the one or more memory devices;
   analyzing a set of values that correspond to a set of effectors of the read operation;

selecting one or more read retry routines from a plurality of read retry routines based on the analyzing, wherein each of the plurality of read retry routines is associated with
a different effector from the set of effectors, and
a read voltage that corresponds to the different effector; and
performing the selected one or more read retry routines on the portion of the one or more memory devices to negate the failure of the read operation.

13. The operation method of clause 12, further comprising:
sensing the set of values at the portion of the one or more memory devices; and
storing the set of values in the memory system based on the sensing, wherein the referring to the set of values comprises referring to the stored set of values.

14. The operation method of clause 13, further comprising performing the sensing of the set of values at designated trigger portions of the one or more memory devices.

15. The operation method of clause 13, wherein the sensing of the set of values comprises assigning a time stamp to a past programming event at the portion of the one or more memory devices.

16. The operation method of clause 13, wherein the sensing of the set of values comprises sensing a temperature at the portion of the one or more memory devices.

17. The operation method of clause 13, wherein the sensing of the set of values comprises logging a read count at the portion of the one or more memory devices.

18. The operation method of clause 12, further comprising storing instructions for executing the plurality of read retry routines at a non-transitory storage medium of a memory controller.

19. The operation method of clause 12, wherein:
the set of values of effectors comprises a time stamp of a past programming event at the portion of the one or more memory devices; and
the selected one or more read retry routines comprises a read retry routine that uses a read voltage that corresponds to a time-based effector of the read operation.

20. The operation method of clause 12, wherein:
the set of values of effectors comprise a temperature at the portion of the one or more memory devices; and
the selected one or more read retry routines comprises a read retry routine that uses a read voltage that corresponds to a temperature-based effector of the read operation.

21. The operation method of clause 12, wherein:
the set of values of effectors comprise a read count at the portion of the one or more memory devices; and
the selected one or more read retry routines comprises a read retry routine that uses a read voltage that corresponds to a read-count-based effector of the read operation.

22. A memory system comprising:
a memory controller coupled to one or more memory devices of the memory system; and
a non-transitory computer-readable medium having instructions stored thereon, that, when executed by the memory controller, cause the memory controller to perform the operation method of any one of clauses 12 to 21.

The breadth and scope of the present disclosure should not be limited by any of the above-described exemplary implementations, but should be defined only in accordance with the following claims and their equivalents.

What is claimed is:
1. A memory system, comprising:
one or more memory devices configured to store data; and
a memory controller coupled to the one or more memory devices and configured to:
detect a failure of a read operation performed at a portion of the one or more memory devices;
determine a trigger portion closest to the portion of the one or more memory devices where the failure of read operation is detected, wherein the trigger portion is one or more memory blocks or one or more memory pages, and wherein the trigger portion is a designated portion on the memory system where sensing and storing a set of values of effectors is performed;
access the set of values of a set of effectors of the read operation associated with the trigger portion;
analyze the set of values that correspond to the set of effectors of the read operation;
select one or more read retry routines from a plurality of read retry routines based on the analyzing, wherein each of the plurality of read retry routines is associated with
a different effector from the set of effectors, and
an adjusted read voltage that corresponds to the different effector; and
perform the selected one or more read retry routines corresponding to each effector of the set of effectors of the read operation at the portion of the one or more memory devices using the adjusted read voltage corresponding to each effector of the set of effectors to negate the failure of the read operation.

2. The memory system of claim 1, wherein the memory controller is further configured to:
sense the set of values at the portion of the one or more memory devices; and
store the set of values in the memory system based on the sensing.

3. The memory system of claim 2, wherein the memory controller is further configured to perform a read retry routine with an adjusted pre-pulse duration different from a pre-pulse duration used in the failed read operation.

4. The memory system of claim 2, wherein the sensing of the set of values comprises assigning a time stamp to a past programming event at the portion of the one or more memory devices.

5. The memory system of claim 2, wherein the sensing of the set of values comprises sensing a temperature at the portion of the one or more memory devices.

6. The memory system of claim 2, wherein the sensing of the set of values comprises logging a read count at the portion of the one or more memory devices.

7. The memory system of claim 1, wherein the one or more memory devices comprise a three-dimensional (3D) NAND memory device.

8. The memory system of claim 1, wherein:
the set of values of effectors comprises a time stamp of a past programming event at the portion of the one or more memory devices; and
the selected one or more read retry routines comprises a read retry routine that uses a read voltage that corresponds to a time-based effector of the read operation.

9. The memory system of claim 1, wherein:
the set of values of effectors comprises a temperature at the portion of the one or more memory devices; and
the selected one or more read retry routines comprises a read retry routine that uses a read voltage that corresponds to a temperature-based effector of the read operation.

10. The memory system of claim 1, wherein:
the set of values of effectors comprises a read count at the portion of the one or more memory devices; and
the selected one or more read retry routines comprises a read retry routine that uses a read voltage that corresponds to a read-count-based effector of the read operation.

11. An operation method of a memory system comprising:
storing data in one or more memory devices of the memory system;
detecting a failure of a read operation performed at a portion of the one or more memory devices;
determining a trigger portion closest to the portion of the one or more memory devices where the failure of read operation is detected, wherein the trigger portion is one or more memory blocks or one or more memory pages, and wherein the trigger portion is a designated portion on the memory system where sensing and storing a set of values of a set of effectors is performed;
accessing the set of values of the set of effectors of the read operation associated with a trigger portion;
analyzing the set of values that correspond to the set of effectors of the read operation;
selecting one or more read retry routines from a plurality of read retry routines based on the analyzing, wherein each of the plurality of read retry routines is associated with
a different effector from the set of effectors, and
an adjusted read voltage that corresponds to the different effector; and
performing the selected one or more read retry routines corresponding to each effector of the set of effectors of the read operation on the portion of the one or more memory devices using the adjusted read voltage corresponding to each effector of the set of effectors to negate the failure of the read operation.

12. The operation method of claim 11, further comprising:
sensing the set of values at the portion of the one or more memory devices; and
storing the set of values in the memory system based on the sensing, wherein the referring to the set of values comprises referring to the stored set of values.

13. The operation method of claim 12, further comprising performing a read retry routine with an adjusted pre-pulse duration different from a pre-pulse duration used in the failed read operation.

14. The operation method of claim 12, wherein the sensing of the set of values comprises assigning a time stamp to a past programming event at the portion of the one or more memory devices.

15. The operation method of claim 12, wherein the sensing of the set of values comprises sensing a temperature at the portion of the one or more memory devices.

16. The operation method of claim 12, wherein the sensing of the set of values comprises logging a read count at the portion of the one or more memory devices.

17. The operation method of claim 11, wherein:
the set of values of effectors comprises a time stamp of a past programming event at the portion of the one or more memory devices; and
the selected one or more read retry routines comprises a read retry routine that uses a read voltage that corresponds to a time-based effector of the read operation.

18. The operation method of claim 11, wherein:
the set of values of effectors comprise a temperature at the portion of the one or more memory devices; and
the selected one or more read retry routines comprises a read retry routine that uses a read voltage that corresponds to a temperature-based effector of the read operation.

19. The operation method of claim 11, wherein:
the set of values of effectors comprise a read count at the portion of the one or more memory devices; and
the selected one or more read retry routines comprises a read retry routine that uses a read voltage that corresponds to a read-count-based effector of the read operation.

20. A memory system comprising:
a memory controller coupled to one or more memory devices of the memory system; and
a non-transitory computer-readable medium having instructions stored thereon, that, when executed by the memory controller, cause the memory controller to perform the operation method of claim 11.

* * * * *